(12) United States Patent
Ahn et al.

(10) Patent No.: US 10,459,553 B2
(45) Date of Patent: Oct. 29, 2019

(54) DISPLAY DEVICE

(71) Applicant: LG Display Co., Ltd., Seoul (KR)

(72) Inventors: JungEun Ahn, Daegu (KR); BoYoung Jung, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 11 days.

(21) Appl. No.: 15/278,672

(22) Filed: Sep. 28, 2016

(65) Prior Publication Data

US 2017/0160852 A1 Jun. 8, 2017

(30) Foreign Application Priority Data

Dec. 7, 2015 (KR) .................. 10-2015-0173547

(51) Int. Cl.
| | |
|---|---|
| *G06F 3/041* | (2006.01) |
| *G06F 3/044* | (2006.01) |
| *G06F 3/047* | (2006.01) |
| *H01L 27/32* | (2006.01) |
| *G02F 1/1333* | (2006.01) |
| *G02F 1/1335* | (2006.01) |
| *G02F 1/1343* | (2006.01) |

(Continued)

(52) U.S. Cl.
CPC ............ *G06F 3/0412* (2013.01); *G06F 3/044* (2013.01); *G06F 3/047* (2013.01); *G06F 3/0416* (2013.01); *H01L 27/323* (2013.01); *H01L 27/3276* (2013.01); *G02F 1/1368* (2013.01); *G02F 1/13338* (2013.01); *G02F 1/13439* (2013.01); *G02F 1/133512* (2013.01); *G02F 1/133514* (2013.01); *G02F 1/134336* (2013.01); *G02F 1/134363* (2013.01); *G02F 1/136286* (2013.01); *G02F 2001/134318* (2013.01); *G02F 2001/136295* (2013.01); *G02F 2201/121* (2013.01); *G02F 2201/123* (2013.01); *G06F 2203/04103* (2013.01); *H01L 27/322* (2013.01); *H01L 51/5284* (2013.01)

(58) Field of Classification Search
None
See application file for complete search history.

(56) References Cited

U.S. PATENT DOCUMENTS

| | | | |
|---|---|---|---|
| 9,046,955 B1 | 6/2015 | Lee et al. | |
| 2008/0129898 A1* | 6/2008 | Moon | ................. G02F 1/13338 349/12 |

(Continued)

FOREIGN PATENT DOCUMENTS

TW 201017498 A1 5/2010

OTHER PUBLICATIONS

Office Action issued in Taiwanese Patent Application No. 105132270 dated Dec. 20, 2016.

*Primary Examiner* — Amare Mengistu
*Assistant Examiner* — Sarvesh J Nadkarni
(74) *Attorney, Agent, or Firm* — Polsinelli PC

(57) ABSTRACT

A display device is provided. A first electrode is disposed in an area defined by a gate line positioned on a first substrate in a first direction and a data line positioned on the first substrate in a second direction to intersect the gate line. A second electrode is disposed in the area and positioned on the substrate in a different layer from the first electrode. A touch signal line is positioned on the first substrate in a different layer from the data line to be positioned above the data line, the touch signal line being connected to the second electrode.

16 Claims, 8 Drawing Sheets

(51) Int. Cl.
*G02F 1/1362* (2006.01)
*G02F 1/1368* (2006.01)
*H01L 51/52* (2006.01)

(56) References Cited

U.S. PATENT DOCUMENTS

2010/0103121 A1* 4/2010 Kim .................... G02F 1/13394
  345/173
2016/0357313 A1* 12/2016 Yang ........................ G06F 3/044

* cited by examiner

DISPLAY DEVICE

CROSS REFERENCE TO RELATED APPLICATION

This application claims priority from Korean Patent Application Number 10-2015-0173547 filed in the Republic of Korea on Dec. 7, 2015, which is hereby incorporated by reference in its entirety.

BACKGROUND

Field of the Disclosure

The present disclosure relates to a display device, and more particularly, to a display device for displaying images. Although the present disclosure is suitable for a wide scope of applications, it is particularly suitable for reducing manufacturing cost and improving an aperture ratio in the display device.

Description of the Background

In response to the development of the information society, demand for a variety of display devices for displaying images is increasing. In this regard, a range of display devices, such as liquid crystal display (LCD) devices, plasma display panels (PDPs), and organic light-emitting display devices, have recently been used.

Many display devices provide touch-based input interfaces enabling users to intuitively and conveniently input data or instructions directly to devices, rather than using conventional input systems, such as buttons, a keyboard, or a mouse.

To provide such touch-based input interfaces, the ability to sense a user touch and accurately detect touched coordinates is required.

In this regard, in the related art, a touch sensing method selected from among a variety of methods of touch sensing, such as resistive touch sensing, capacitive touch sensing, electromagnetic induction, infrared (IR) touch sensing, and ultrasonic touch sensing, enables touch sensing.

In addition, regarding the use of touchscreens in display devices, development has been undertaken toward touch sensors disposed within the display device. In particular, the development of in-cell display devices using common electrodes disposed on the bottom substrate as touch sensing electrodes is ongoing.

However, in-cell display devices require detailed processing since a touch sensing electrode must be formed. This increases fabrication costs and may require an extended period of time for fabrication, thereby lowering the price competitiveness of products.

SUMMARY

Various aspects of the present disclosure provide a display device having a touchscreen panel integrated therewith and a method of fabricating the same, the display panel being configured to simplify a fabrication process thereof and improve an aperture ratio.

According to an aspect of the present disclosure, a display device may include: a first substrate, a plurality of gate lines, a plurality of data lines, a thin film transistor, a first electrode, a second electrode and a touch signal line. The plurality of gate lines and the plurality of data lines are on the first substrate to define a plurality of pixels. The thin film transistor includes a source electrode, a drain electrode and a gate electrode at the sub-pixels. The first electrode is disposed on the sub-pixels. The second electrode is overlapped with the first electrode. The touch signal line is parallel to the data line, wherein a width of the touch signal line is wider than a width of the data line.

According to a display device in an aspect of the present disclosure, the second electrode functions as a common electrode in a display mode and functions as a touch electrode in a touch mode.

According to a display device in an aspect of the present disclosure, the second electrode is block-shaped pattern or a pattern including toothed portions.

According to a display device in an aspect of the present disclosure, the first electrode is connected to one of the drain electrode or the source electrode.

According to a display device in an aspect of the present disclosure, the first electrode is block-shaped pattern or a pattern including toothed portions.

According to a display device in an aspect of the present disclosure, the display device includes a protective layer between the first electrode and the second electrode.

According to a display device in an aspect of the present disclosure, the display device includes a protective layer between the touch signal line and the data line.

According to a display device in an aspect of the present disclosure, the second electrode is connected to the touch signal line through a contact hole.

According to a display device in an aspect of the present disclosure, the contact hole is overlapped with a part of the gate line.

According to a display device in an aspect of the present disclosure, the data line, the touch signal line, opposite edges of the first electrode and opposite edges of the second electrode are parallel to one another.

According to a display device in an aspect of the present disclosure, the display device includes a second substrate opposing the first substrate, and the second substrate includes a plurality of color filters facing the first electrode.

According to a display device in an aspect of the present disclosure, an orthogonal projection of the touch signal line on the second substrate is positioned between a plurality of orthogonal projections of the color filters on the second substrate.

According to a display device in an aspect of the present disclosure, an orthogonal projection of the data line on the second substrate is positioned between a plurality of orthogonal projections of the color filters on the second substrate.

According to a display device in an aspect of the present disclosure, a distance between each two of the plurality of the color filters is larger than the width of the touch signal line or the data line.

According to a display device in an aspect of the present disclosure, the touch signal line, the data line and the second electrode overlapped with a part of the gate line.

According to the present disclosure as set forth above, it is possible to simplify the fabrication process of the display device having a touchscreen panel integrated therewith and improve the aperture ratio of the display device.

It is to be understood that both the forgoing general description and the following detailed description are exemplary and explanatory and are intended to provide further explanation of the disclosure as claimed.

BRIEF DESCRIPTION OF THE DRAWINGS

The above and other objects, features and advantages of the present disclosure will be more clearly understood from the following detailed description when taken in conjunction with the accompanying drawings, in which.

DETAILED DESCRIPTION

Figure 1:
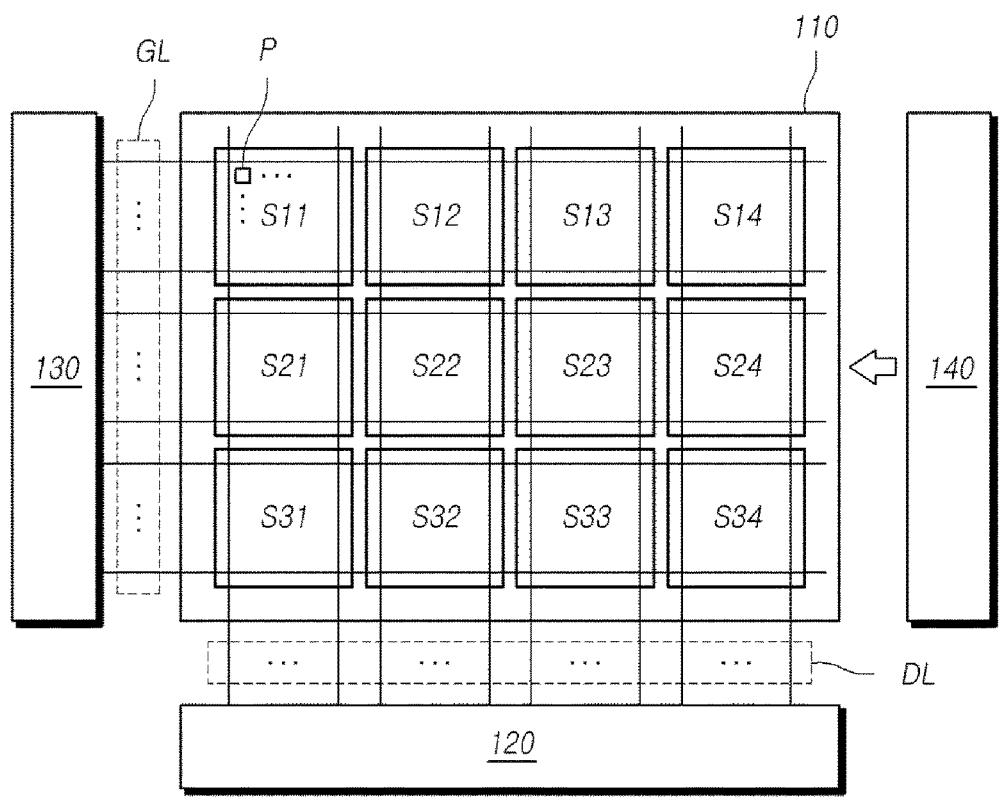
FIG. 1 schematically illustrates a display device having a touchscreen panel integrated therewith according to an exemplary embodiment.

Hereinafter, reference will be made to embodiments of the present disclosure in detail, examples of which are illustrated in the accompanying drawings. Throughout this document, reference should be made to the drawings, in which the same reference numerals and signs will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

The present disclosure provides a display device using a process method of using a metal material in the formation of touch signal lines connecting pixel electrodes to the source electrodes or drain electrodes (or bringing pixel electrodes into contact with the source electrodes or drain electrodes), the display device including a connecting pattern structure connecting the source electrodes or the drain electrodes to the pixel electrodes.

FIG. 1 schematically illustrates a display device having a touchscreen panel integrated therewith according to the present disclosure.

Referring to FIG. 1, the display device 100 having a touchscreen panel integrated therewith according to the present disclosure includes a panel 110, a data driver circuit 120, a gate driver circuit 130, and a touch integrated circuit (IC) 140 for controlling touch signals.

The panel 110 has a plurality of gate lines GL arranged thereon in a first direction (e.g. in a row or in a column) and a plurality of data lines DL arranged thereon in a second direction (e.g. in a column or in a row). A plurality of pixels P are defined on the panel 110 by a plurality of points at which the plurality of data lines DL intersect the plurality of gate lines GL.

In each pixel area of the plurality of pixels P, a source or drain electrode is connected to a corresponding data line of the plurality of data lines DL, a gate electrode is connected to a corresponding gate line of the plurality of gate lines GL, and the drain electrode or the source electrode is connected to a pixel electrode (or a first electrode).

In addition, a plurality of electrodes S11 to S14, S21 to S24, and S31 to S34 are formed on the panel 110 to be spaced apart from each other by a predetermined distance. The plurality of electrodes S11 to S14, S21 to S24, and S31 to S34 are grouped or blocked into a plurality of electrode groups.

The panel 110 functions as a "display panel" while acting as a "touchscreen panel (TSP)."

That is, the panel 110 may refer to a panel in which a display panel and a touchscreen panel are integrated or a display panel in which an in-cell touchscreen panel is embedded.

When the panel 110 functions as a display panel, the driving mode of the panel 110 is referred to as a "display driving mode." When the panel 110 functions as a touchscreen panel, the driving mode of the panel 110 is referred to as a "touch driving mode."

When the driving mode of the panel 110 is the display driving mode, the data driver circuit 120 supplies data voltages Vdata or data signals to the plurality of data lines LD for display use.

When the driving mode of the panel 110 is the display driving mode, the gate driver circuit 130 supplies a gate signal or a scanning signal to the plurality of gate lines GL sequentially for display use.

When the driving mode of the panel 110 is the touch driving mode, the touch IC 140 applies a touch driving signal to all or portions of the plurality of electrodes S11 to S14, S21 to S24 and S31 to S34 that are directly connected thereto via touch signal lines. The touch driving signal is also referred to as a touch sensing signal, a touch sensing voltage, or a touch drive voltage Vtd.

For example, when the driving mode of the panel 110 is the touch driving mode, the touch IC 140 applies the touch driving signal to all or portions of the plurality of electrode groups into which the plurality of electrodes S11 to S14, S21 to S24, and S31 to S34 are grouped.

The display device 100 having a touchscreen panel integrated therewith according to the present disclosure further includes a timing controller (not shown) controlling the driving timing of the data driver circuit 120 and the gate driver circuit 130.

In addition, the display device 100 having a touchscreen panel integrated therewith to the present disclosure further includes a touch controller (not shown) detecting a touch, the touched coordinates, and so on by receiving sensing data (e.g. capacitance, a change in capacitance, or a voltage) measured by the touch IC 140 via the plurality of electrodes S11 to S14, S21 to S24, and S31 to S34 that function as touch electrodes.

The panel 110 of the display device 100 having a touchscreen panel integrated therewith according to the present disclosure operates alternately in the display driving mode and the touch driving mode. The timing of the display driving mode and the timing of the touch driving mode may be controlled in response to control signals output by the timing controller, the touch controller or so on, or in some cases, may be controlled by the timing controller and the touch controller working in concert with each other.

The display device 100 having a touchscreen panel integrated therewith according to the present disclosure employs capacitive touch sensing to detect a touch and the touched coordinates based on changes in capacitance using a plurality of touch electrodes (e.g. electrodes arranged in rows and electrodes arranged in columns) disposed on the touchscreen panel.

This type of capacitive touch sensing can be categorized, for example, as mutual capacitive touch sensing and self-capacitive touch sensing.

Mutual capacitive touch sensing, an example of capacitive touch sensing, enables touch electrodes disposed in one direction, among the touch electrodes arranged in rows and columns, to function as transmitting (Tx) electrodes (also referred to as driving electrodes) to which a driving voltage is applied and touch electrodes disposed in the other direction to function as receiving (Rx) electrodes (also referred to as sensing electrodes) to sense the driving voltage and form capacitance together with the Tx electrodes. A touch and touched coordinates are detected based on changes in capacitance (i.e., mutual capacitance) between the Tx electrodes and the Rx electrodes depending on the presence of a pointer, such as a finger or a pen.

On the other hand, self-capacitive touch sensing, another example of capacitive touch sensing, includes: forming capacitance (i.e., self-capacitance) between the specific touch electrodes and a pointer, such as a finger or a pen; measuring capacitance values between the touch electrodes and the pointer, such as a finger or a pen, depending on the presence of the pointer; and sensing a touch and touched coordinates based on the detected capacitance values. Unlike the mutual capacitive touch sensing, the self-capacitive touch sensing concurrently applies and senses a driving voltage (a touch driving signal) through the touch electrodes. Therefore, such self-capacitive touch sensing does not distinguish between the Tx electrodes and the Rx electrodes.

The display device 100 having a touchscreen panel integrated therewith according to the present disclosure can employ one of the two above-described types of capacitive touch sensing, such as mutual capacitive touch sensing and self-capacitive touch sensing. Herein, a case in which self-capacitive touch sensing is employed will be taken for the convenience of explanation.

The data driver circuit 120 includes one or more data driver integrated circuits (ICs) (also referred to as source driver ICs). The data driver ICs may be connected to the bonding pads of the panel 110 by tape automated bonding (TAB) or chip on glass (COG) bonding, may be directly formed on the panel 110, or in some cases, may be integrated with the panel 110.

The gate driver circuit 130 is positioned on one side of the panel 110, as illustrated in FIG. 1. Depending on the driving method, the gate driver circuit 130 may be divided into two sections positioned on both sides of the panel 110.

The gate driver circuit 130 includes one or more gate driver integrated circuits (ICs). The gate driver ICs may be connected to the bonding pads of the panel 110 by tape automated bonding (TAB) or chip on glass (COG) bonding, may be implemented as gate in panel (GIP)-type ICs directly formed on the panel 110, or in some cases, may be integrated with the panel 110.

As illustrated in FIG. 1, the above-described touch IC 140 is disposed outside of the data driver circuit 120 and the gate driver circuit 130, as a component separate therefrom. Alternatively, the touch IC 140 may be implemented as an internal component of another separate driver IC (e.g. a display driver IC) including at least one of the data driver circuit 120 and the gate driver circuit 130 or may be implemented as an internal component of the data driver circuit 120 or the gate driver circuit 130.

Therefore, in the touch driving mode, the application of a touch driving signal by the touch IC 140 to all or portions of the plurality of electrodes functioning as the touch electrodes in the touch driving mode may be implemented by the separate driver IC including the touch IC 140 applying the touch driving signal to all or portions of the plurality of electrodes functioning as the touch electrodes. Depending on design, the data driver circuit 120 or the gate driver circuit 130 including the touch IC 140 may apply the touch driving signal to all or portions of the plurality of electrodes functioning as the touch electrodes.

The touch IC 140 is not limited to the above-described implementation or design. It should be understood that the touch IC 140 may be implemented as any configuration or an internal or external component thereof, the functions of which are equivalent or similar to those described herein.

Although the touch IC 140 is illustrated as being a single circuit in FIG. 1, the touch IC 140 may be implemented as two or more circuits or sections.

The touch IC 140 needs a separate touch signal line configuration connected to each of the plurality of electrodes, for example, S11 to S14, S21 to S24, and S31 to S34, to apply the touch driving signal to all or portions of the plurality of electrodes S11 to S14, S21 to S24, and S31 to S34.

A plurality of touch signal lines may be disposed on the panel 110 in a first direction (e.g. in rows) or in a second direction (e.g. in columns). Each of the plurality of touch signal lines is connected to a corresponding electrode of the plurality of electrodes S11 to S14, S21 to S24, and S31 to S34 to transfer a touch driving signal or a common voltage thereto.

When two or more touch signal lines are connected to each of the plurality of electrodes S11 to S14, S21 to S24, and S31 to S34, resistance can be reduced.

The direction in which at least one touch signal line connected to each of the plurality of electrodes S11 to S14, S21 to S24, and S31 to S34 is formed may differ depending on whether sensing is performed by grouping the plurality of electrodes S11 to S14, S21 to S24, and S31 to S34 in the first direction (e.g. in a row) in which the gate lines GL are formed or in the second direction (e.g. in a column) in which the data lines DL are formed.

Figure 3:
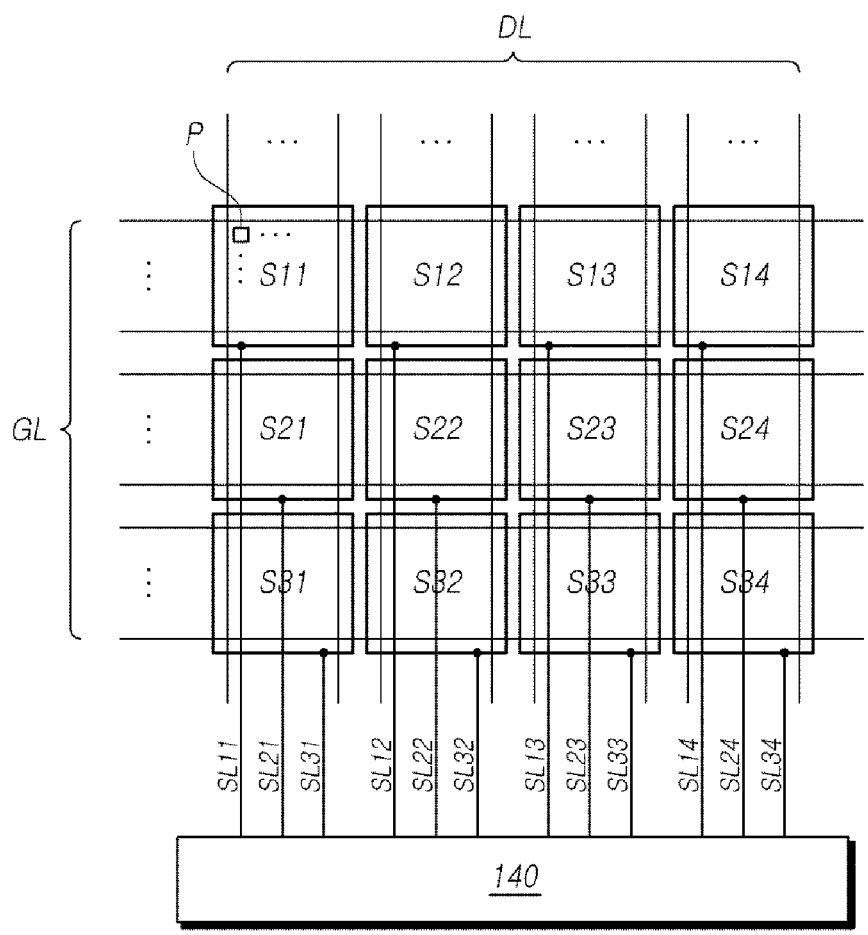
FIG. 3 is a plan view illustrating the panel included in a display device having a touchscreen panel integrated therewith according to the exemplary embodiment.

When sensing is performed by grouping the plurality of electrodes S11 to S14, S21 to S24, and S31 to S34 in the second direction (e.g. in a column) in which the data lines DL are formed, at least one touch signal line connected to each of the plurality of electrodes S11 to S14, S21 to S24, and S31 to S34 can be formed in the second direction (e.g. in a column) in which the data lines DL are formed (see FIG. 3).

When sensing is performed by grouping the plurality of electrodes S11 to S14, S21 to S24, and S31 to S34 in the first direction (e.g. in a row) in which the gate lines GL are formed, at least one touch signal line connected to each of the plurality of electrodes S11 to S14, S21 to S24, and S31 to S34 can be formed in the first direction (e.g. in a row) in which the gate lines GL are formed. Herein, a case in which at least one touch signal line connected to each of the plurality of electrodes S11 to S14, S21 to S24, and S31 to S34 is arranged in the second direction (e.g. in a column) in which the data lines DL are formed will be taken for the convenience of explanation.

As described above, the plurality of electrodes S11 to S14, S21 to S24, and S31 to S34 stated herein function as the "touch electrodes" to at least a portion of which the touch driving signal is applied when the driving mode is the touch driving mode. When the driving mode is the display driving mode, the plurality of electrodes S11 to S14, S21 to S24, and S31 to S34 function as the "common electrodes" which oppose pixel electrodes formed on the panel and to which a common voltage Vcom is applied. The electrodes functioning as the touch electrodes or the common electrodes depending on the driving mode are referred to as "second electrodes."

The display device 100 having a touchscreen panel integrated therewith according to the present disclosure may be, for example, an in-plane switching liquid crystal display (IPS LCD) device that displays an image on the screen by rotating horizontally-arranged liquid crystal molecules in positions thereof. The IPS LCD has advantages, such as higher resolution, lower power consumption, and a wide viewing angle. More specifically, the display device 100 having a touchscreen panel integrated therewith may be an advanced high performance in-plane switching (AH-IPS) LCD.

The pixel electrodes and the common electrodes S11 to S14, S21 to S24, and S31 to S34 may be formed on the same substrate such that a lateral electric field is formed between the pixel electrodes and the common electrodes S11 to S14, S21 to S24, and S31 to S34 in the display driving mode.

Alternatively, the display device 100 having a touchscreen panel integrated therewith according to the present embodiment may be an organic light-emitting display having an organic light-emitting layer disposed between a pixel electrode and a common electrode. Here, the pixel electrode and the common electrode may be formed on the same substrate.

Figure 2:
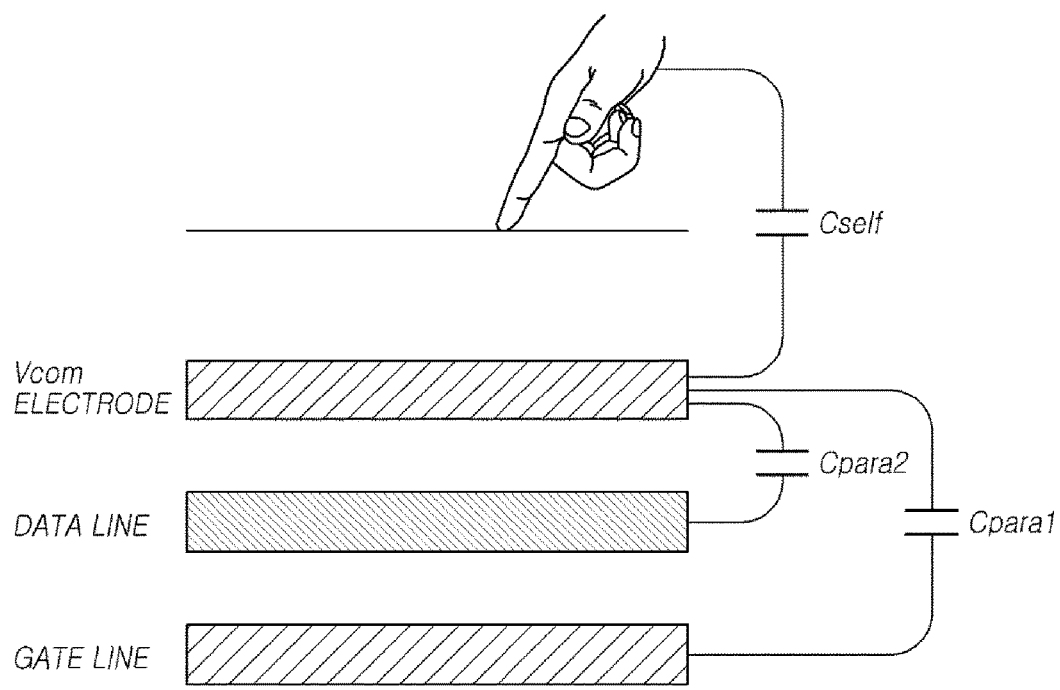
FIG. 2 illustrates capacitance components formed during a touch driving mode in the display device having a touchscreen panel integrated therewith according to the exemplary embodiment.

FIG. 2 illustrates capacitance components Cself, Cpara1, and Cpara2 formed during the touch driving mode in the display device having a touchscreen panel integrated therewith according to the present disclosure.

Referring to FIG. 2, each of the plurality of electrodes S11 to S14, S21 to S24, and S31 to S34, which function as the touch electrodes in the touch driving mode and the common electrodes which form liquid crystal capacitors together with the pixel electrodes in the display driving mode, forms a self-capacitance Cself together with a pointer, such as a finger or pen, to detect a touch and the touched coordinates in the touch driving mode. Each of the plurality of electrodes may also form parasitic capacitance components Cpara1 and Cpara2 together with a gate line and a data line in the touch driving mode. The parasitic capacitance components can be disregarded since they are significantly smaller than the self-capacitance components.

Hereinafter, more detailed descriptions will be made of the panel 110 of the display device 100 having a touchscreen panel integrated therewith according to the present disclosure, the method of applying a common voltage and a touch driving signal to the plurality of electrodes S11 to S14, S21 to S24, and S31 to S34 that function as both the common electrodes and the touch electrodes, the method of applying a data voltage and a touch driving signal (or a signal corresponding to the touch driving signal) to the data lines DL, the method of applying a data voltage and a touch driving signal (or a signal corresponding to the touch driving signal) to the gate lines GL, and so on.

First, with reference to FIG. 3, a more detailed description will be made of the panel 110 of the display device 100 having a touchscreen panel integrated therewith according to the present disclosure.

FIG. 3 is a plan view illustrating the panel included in the display device having a touchscreen panel integrated therewith according to the present disclosure.

Referring to FIG. 3, the panel 110 has the plurality of data lines DL, the plurality of gate lines GL, and the plurality of electrodes S11 to S14, S21 to S24, and S31 to S34 formed thereon, as described above.

As described above, the panel 110 can be alternatively operated in both the display driving mode and the touch driving mode.

In this regard, the plurality of data lines DL and the plurality of gate lines GL disposed on the panel 110 are components enabling the panel 110 to act as the display panel.

In addition, the plurality of electrodes S11 to S14, S21 to S24, and S31 to S34 disposed on the panel 110 are components enabling the panel 110 to act as both a display panel and a touchscreen panel.

More specifically, when the panel 110 acts as the display panel, i.e. when the panel 110 operates in the display driving mode, a common voltage Vcom is applied to the plurality of electrodes S11 to S14, S21 to S24, and S31 to S34, so that the plurality of electrodes S11 to S14, S21 to S24, and S31 to S34 function as common electrodes (also referred to "Vcom electrodes") opposing pixel electrodes (not shown).

When the panel 110 acts as the touchscreen panel, i.e. when the panel 110 operates in the touch driving mode, a touch driving voltage is applied to the plurality of electrodes S11 to S14, S21 to S24, and S31 to S34, so that the plurality of electrodes S11 to S14, S21 to S24, and S31 to S34 form capacitors together with a touch pointer (e.g. a finger or a pen) and function as "touch electrodes" to measure the capacitance levels of the capacitors formed in this manner.

In other words, the plurality of electrodes S11 to S14, S21 to S24, and S31 to S34 function as the "common or Vcom electrodes" in the display driving mode and function as the "touch electrodes" in the touch driving mode.

The plurality of electrodes S11 to S14, S21 to S24, and S31 to S34 have the common voltage Vcom applied thereto in the display driving mode and the touch driving signal applied thereto in the touch driving mode.

Thus, as illustrated in FIG. 3, touch signal lines SL11 to SL14, SL21 to SL24, and SL31 to SL34 are respectively connected to the plurality of electrodes S11 to S14, S21 to S24, and S31 to S34 to transfer the common voltage or the touch driving signal to the plurality of electrodes S11 to S14, S21 to S24, and S31 to S34.

With this configuration, in the touch driving mode, the touch driving signal Vtd generated by the touch IC 140 is transferred to all or portions of the plurality of electrodes S11 to S14, S21 to S24, and S31 to S34 via the touch signal lines SL11 to SL14, SL21 to SL24, and SL31 to SL34, respectively. In the display driving mode, the common voltage Vcom supplied by a common voltage source (not shown) is applied to the plurality of electrodes S11 to S14, S21 to S24, and S31 to S34 via the touch signal lines SL11 to SL14, SL21 to SL24, and SL31 to SL34, respectively.

Referring to FIG. 3, the pixels P are defined to correspond to points at which the plurality of data lines DL intersect the plurality of gate lines GL formed on the panel 110. Here, each of the pixels P may be one pixel among red (R), green (G) and blue (B) pixels.

Referring to FIG. 3, two or more pixels P may be defined in an area (hereinafter also referred to as a "unit touch electrode area") in which each of the plurality of electrodes S11 to S14, S21 to S24, and S31 to S34 functioning as both the common electrodes and the touch electrodes is disposed. That is, each of the plurality of electrodes S11 to S14, S21 to S24, and S31 to S34 corresponds to two or more pixels P.

For example, n×3 number of data lines DL and m number of gate lines GL may be disposed in a single area (unit touch electrode area) in which each of the plurality of electrodes S11 to S14, S21 to S24, and S31 to S34 functioning as both the common electrodes and the touch electrodes is disposed, thereby defining n×3×m number of pixels P.

Each of the plurality of electrodes S11 to S14, S21 to S24, and S31 to S34 functioning as the common electrodes and the touch electrodes may be formed to have a block-shaped pattern, as shown in FIG. 3, and alternatively, may be formed to have a pattern including toothed portions. The present disclosure is applicable in the case in which each of the plurality of electrodes S11 to S14, S21 to S24, and S31 to S34 functioning as the common electrodes and the touch electrodes is formed to have a pattern including toothed portions.

Although the plurality of electrodes described herein to function as both the touch electrodes and the common electrodes are illustrated in the drawings as being 12 electrodes arranged in the shape of a 3×4 matrix containing 3 rows and 4 columns, this is only illustrative for the convenience of description. The plurality of electrodes functioning as both the touch electrodes and the common electrodes may be arranged in a variety of matrix shapes and in various numbers in consideration of the size of the display device 100 having a touchscreen panel integrated therewith and the panel 110, the design criteria of the touch system, and so on.

The display device according to the present disclosure may be, but not limited to, a liquid crystal display (LCD) device or an organic light-emitting display device.

As described above, the plurality of electrodes S11 to S14, S21 to S24, and S31 to S34 grouped or blocked into a plurality of electrode groups are disposed on the panel 110 to be spaced apart from each other by a predetermined distance, as described above.

Figure 4:
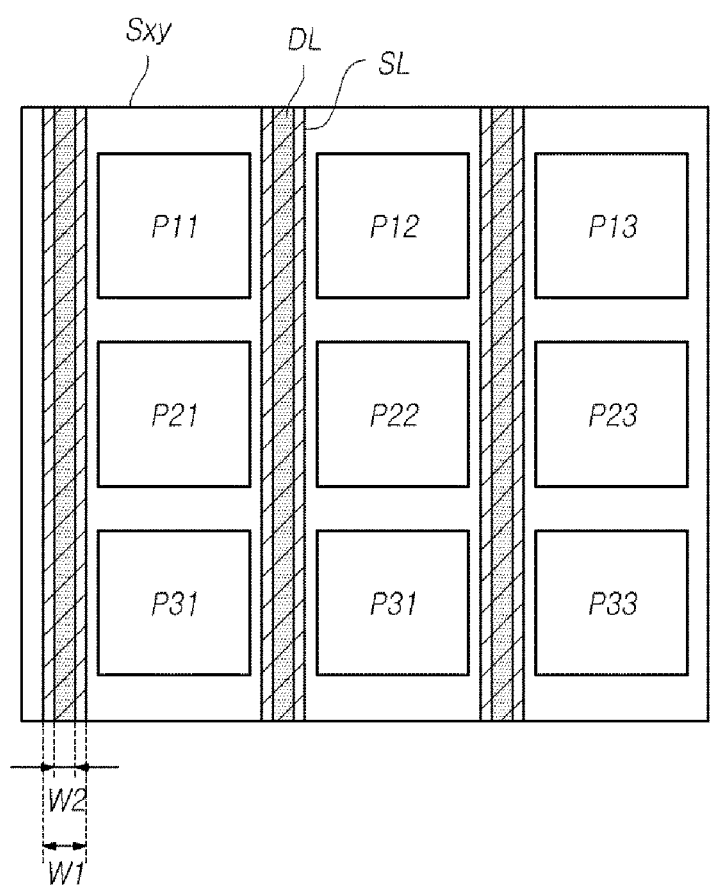
FIG. 4 is a plan view illustrating a part of the panel illustrated in FIG. 3.

FIG. 4 is a plan view illustrating a part of the panel illustrated in FIG. 3.

As illustrated in FIG. 4, one electrode Sxy among the plurality of electrodes S11 to S14, S21 to S24, and S31 to S34, which functions as the common electrode and the touch electrode, may be a second electrode that functions as the "touch electrode" when the driving mode is the touch driving mode and functions as the "common electrode" opposing a pixel electrode (e.g. a first electrode) formed on the panel, with a common voltage Vcom being applied thereto, when the driving mode is the display driving mode.

In the unit touch electrode area in which the second electrode Sxy is formed, two or more pixels P may be defined to correspond to points at which the plurality of data lines DL intersect the plurality of gate lines GL. Here, each of the pixels P may be one pixel among red (R), green (G) and blue (B) pixels.

Although a plurality of pixels, for example, 3×3 pixels P11 to P33, are arranged in the unit touch electrode area in which the second electrode Sxy is disposed, this is only illustrated for the sake of convenience of explanation. A variety of numbers of pixels may be formed in consideration of the sizes of the display device 100 having a touchscreen panel integrated therewith and the panel 110, the criteria of the design of a touch system, and so on.

On the panel 110, single data lines DL are arranged in the second direction for the pixels P11 to P31, P12 to P32, and P13 to P33 arranged in the second direction. For example, in the unit touch electrode area in which the second electrode Sxy is disposed, three data lines DL and three gate lines GL may be arranged for 3×3 pixels P11 to P31, P12 to P32, and P13 to P33.

Two or more touch signal lines SL may be connected to the second electrode Sxy to reduce line resistance. As illustrated in FIG. 4, the touch signal lines SL are arranged to overlap the data lines DL for the single second electrode Sxy. That is, three touch signal lines SL are arranged to correspond to three data lines DL. The widths W1 of the touch signal lines are wider than the widths W2 of the data lines. A single data line DL is arranged in the second direction for each of the pixels P11 to P31, P12 to P32, and P13 to P33 arranged in the second direction, and a single touch signal line SL is arranged to correspond to each data line. Thus, as will be described later, the touch signal line SL functions as a black matrix for each of the pixels. It is therefore not required to provide a separate black matrix.

Hereinafter, an exemplary embodiment in which the second electrode Sxy is formed to have a pattern including a toothcomb portion will be described with reference to FIG. 5 and FIG. 6, and an exemplary embodiment in which the second electrode Sxy is formed to have a block-shaped pattern will be described with reference to FIG. 7. Although the display device will be described as an LCD device, the display device may also be an organic light-emitting display device.

Figure 5:
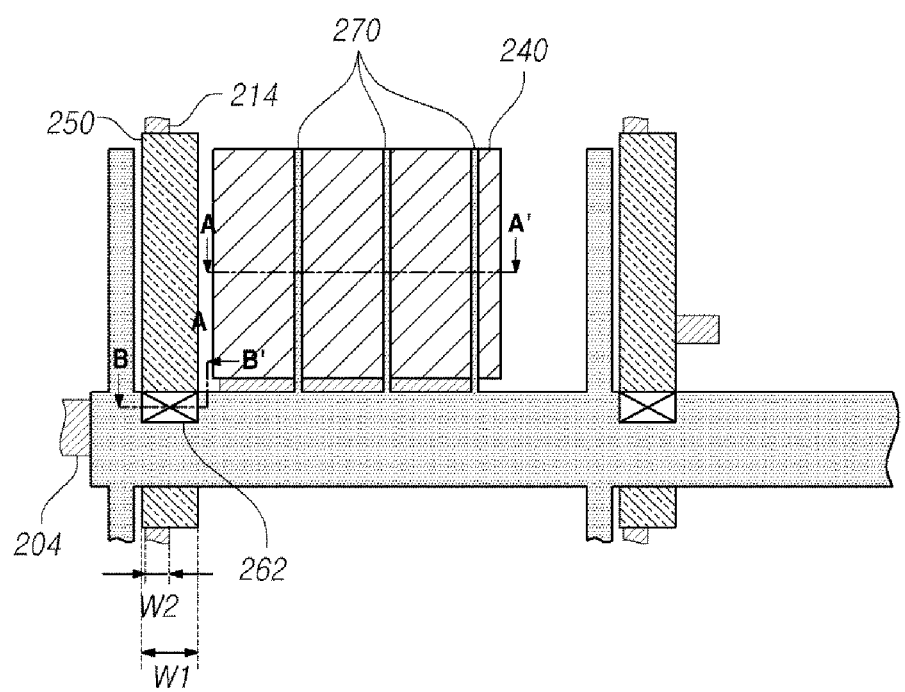
FIG. 5 is a plan view illustrating a display device according to another exemplary embodiment.
Figure 6:
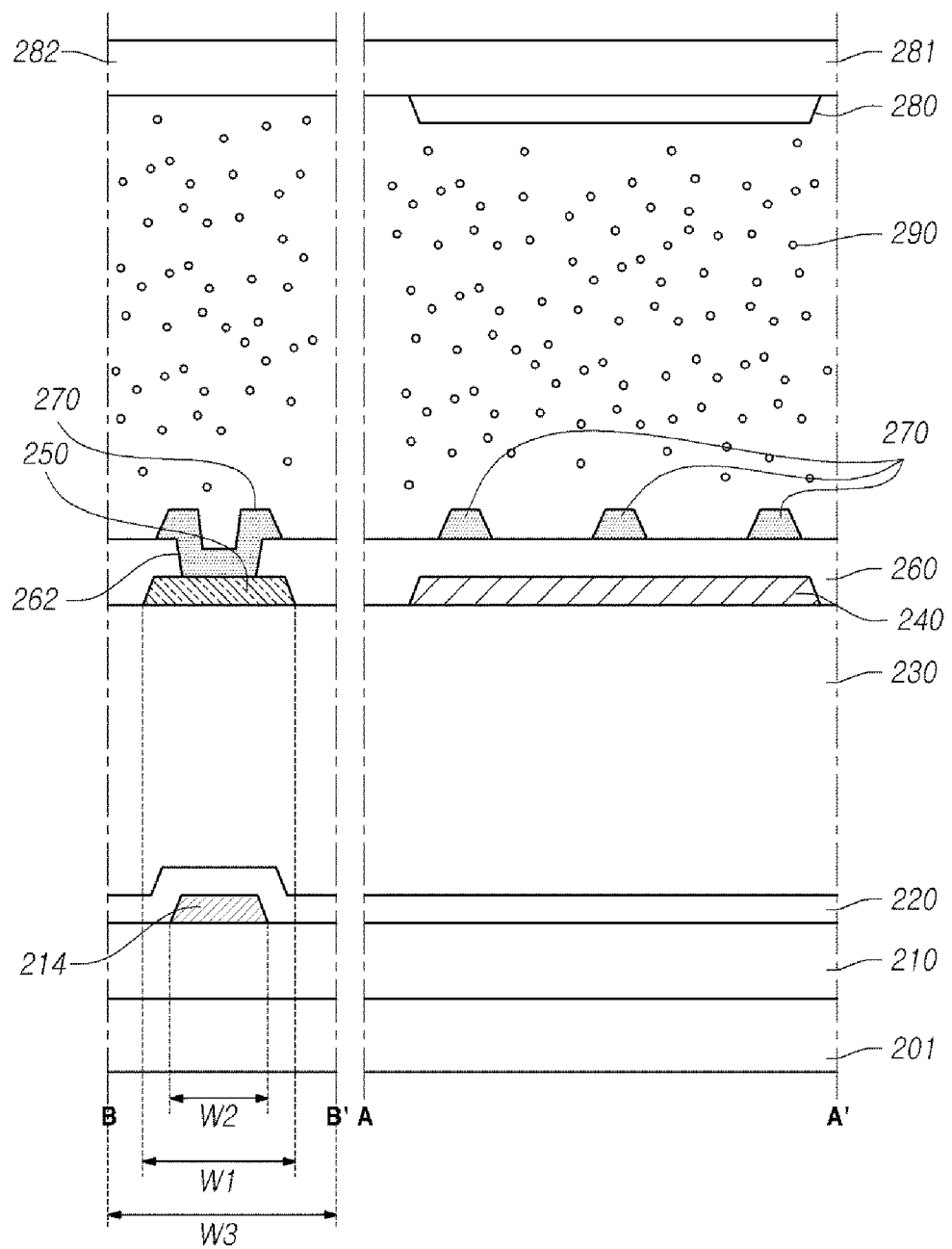
FIG. 6 is a cross-sectional view taken along line A-A' and line B-B' in FIG. 5.

FIG. 5 is a plan view illustrating a display device according to another exemplary embodiment, and FIG. 6 is a cross-sectional view taken along line A-A' and line B-B' in FIG. 5.

Referring to FIG. 5 and FIG. 6, the display device 200 according to the present disclosure includes: a gate line 204 arranged on a first substrate 201 in a first direction, a gate signal being transferred through the gate line 204; a data line 214 arranged on the first substrate 201 in a second direction, a data signal being transferred through the data line 214; a first electrode 240 disposed in an area in which the gate line 204 arranged on the first substrate 201 in the first direction intersects the data line 214 arranged on the first substrate 201 in the second direction; a second electrode 270 disposed on the first substrate 201 in a different layer from the first electrode 240; and a touch signal line 250 disposed above the first substrate 201. The touch signal line 250 is parallel to the first electrode 240.

A gate insulating film 210 is disposed on the first substrate 201, and an interlayer insulating film 220 is disposed on the gate insulating film 210.

A thin-film transistor Tr is disposed in each of the pixels defined by the intersections of the gate lines 204 and the data lines 214. The thin-film transistor Tr is formed by a gate electrode connected to the gate line 204, an activation layer, and source/drain electrodes connected to the data line 214. The gate line 204 and the gate electrode are disposed on the first substrate 201, and the gate insulating film 210 is disposed on the gate line 204 and the gate electrode.

The data line 214 and the source/drain electrodes are disposed on the gate insulating film 210, and an interlayer insulating film 220 and a first protective layer 230 are disposed on the data line 214 and the source/drain electrodes.

The first electrode 240 is disposed on the first protective layer 230. The first electrode 240 may have a block-shaped pattern. The first electrode 240 is connected to the source electrode or the drain electrode of the thin-film transistor Tr. The first electrode 240 may be formed of, for example, a metal oxide, such as indium tin oxide (ITO) or indium zinc oxide (IZO), a mixture of a metal and an oxide, such as ZnO:Al or SnO2:Sb, and a conductive polymer, such as poly(3-methylthiophene), Poly[3,4-(ethylene-1,2-dioxy) thiophene] (PEDT), polypyrrole, and polyaniline. Alternatively, the first electrode 240 may be formed of, for example, carbon nanotubes (CNTs), graphene, or silver (Ag) nanowires.

The touch signal line 250 is disposed on the first protective layer 230. As illustrated in FIG. 5, although the touch signal line 250 and the data line 214 may be disposed on different layers, i.e. in upper and lower layers, the present disclosure is not limited thereto.

The touch signal line 250 may overlap the data line 214. Although the width W1 of the touch signal line 250 is wider than the width W2 of the data line 214, but the present disclosure is not limited thereto. For example, the width W1 of the touch signal line 250 may be substantially equal to the width W2 of the data line 214, or may be narrower than the width W2 of the data line 214, as long as the difference therebetween is relatively insignificant.

Since the touch signal line 250, the width W1 of which is wider than the width W2 of the data line 214, is disposed on a different layer from the data line 214, the touch signal line 250 can function as a black matrix for the corresponding pixels.

The touch signal line 250 may be formed as a monolayer structure or a multilayer structure. The touch signal line 250 may be formed of at least one of aluminum (Al), tungsten (W), copper (Cu), molybdenum (Mo), chromium (Cr), titanium (Ti), molybdenum tungsten (MoW), molybdenum titanium (MoTi), and copper/molybdenum titanium (Cu/MoTi). The composition of the touch signal line 250 may further include one of indium tin oxide (ITO), indium zinc oxide (IZO), and carbon nanotubes (CNTs) to form a transparent conductive material layer.

A second protective layer 260 including a contact hole 262, and the second protective layer 260 is disposed on the first electrode 240 and the touch signal line 250. The contact hole 262 is overlapped with a part of the gate line 204. Specifically, an orthogonal projection of the contact hole 262 on the first substrate 201 is overlapped with a part of an orthogonal projection of the gate line 204 on the first substrate 201.

The second electrode 270 is disposed on the second protective layer 260. The second electrode 270 is connected to the touch signal line 250 through the contact hole 262. The second electrode 270 functions as a common electrode to which a common voltage is applied through the touch signal line 250 when the display device 200 operates in the display mode and functions as a touch electrode to which a touch driving signal is applied through the touch signal line 250 when the display device 200 operates in the touch mode.

The data line 214, the touch signal line 250, opposite edges of the first electrode 240 and opposite edges of the second electrode 270 may be parallel to one another. Specifically, the data line 214, the touch signal line 250, opposite edges of the first electrode 240 and opposite edges of the second electrode 270 may be parallel to one another in an area around the pixel. The data line 214, the touch signal line 250 and the second electrode 270 may be overlapped with a part of the gate line 204.

Here, the display device 200 has a pixel structure in which the first electrode 240 and the second electrode 270 are disposed under and on the second protective layer 260. The second electrode 270 is formed to have a pattern including toothed portions. The first electrode 240 and the second electrode 270 are positioned in different layers while intersecting each other.

The display device 200 further includes a second substrate 281 opposing the first substrate 201 and a liquid crystal layer 290 situated between the first substrate 201 and the second substrate 281. The second substrate 281 has a plurality of color filters 280 opposing or facing the first electrode 240. Thus, the display device 200 may be a liquid crystal display (LCD) device. When the display device 200 includes neither the second substrate 281 nor the liquid crystal layer 290 and has an internal configuration for an organic light-emitting display device as described above, the display device 200 may be a different type of display device, such as an organic light-emitting display device.

In general, when the second substrate 281 has the color filter 280, a black matrix is situated between the second substrate 281 and the color filter 280 to prevent color interference and light leakage between pixels. However, according to the present disclosure, no black matrix is disposed in a position on the second substrate 281 corresponding to the touch signal line 250 of the first substrate 201. Although an area 282 of the second substrate 281 having no black matrix therein may form a hollow space as illustrated in FIG. 6, the color filter 280 may occupy at least a portion of the area 282. Any component other than the black matrix or the color filter 280 may be disposed in the area 282 as required.

In the first substrate 201, the width W1 of the touch signal line 250 is wider than the width W2 of the data line 214. The width W3 of the area 282 in the second substrate 281 without the black matrix is wider than the width W1 of the touch signal line 250. However, the present disclosure is not limited thereto.

As described above, the touch signal line 250, the width W1 of which is wider than the width W2 of the data line 214, is positioned in a different layer to the data line 214 to function as a black matrix. It is thereby possible to prevent color interference and light leakage between pixels even in the case in which no black matrix is disposed on the second substrate 281.

An orthogonal projection of the touch signal line 250 on the second substrate 281 may be positioned between the plurality of orthogonal projections of the color filters 280 on the second substrate 281. Specifically, the orthogonal projection of the touch signal line 250 on the second substrate 281 may be positioned between two orthogonal projections of two color filters 280 in two adjacent pixels on the second substrate 281.

An orthogonal projection of the data line 214 on the first substrate 201 may be positioned between the plurality of the color filters 280 on the second substrate 281. Specifically, the data line 214 on the first substrate 201 may be positioned between two color filters 280 in two adjacent pixels on the second substrate 281.

A distance between each two of the plurality of the color filters 280 may be larger than the width of the touch signal line 250 or the data line 214. Specifically, the distance between two color filters 280 in two adjacent pixels on the second substrate 281 may be larger than the width of the touch signal line 250 or the data line 214.

Since the touch signal line 250, the width W1 of which is narrower than the width W3 of the area 282 corresponding to the black matrix, functions as the black matrix, the transmittance or the aperture ratio of the display device 200 can be improved by an amount corresponding to the difference W3−W1 between the width W3 of the area 282 corresponding to the black matrix and the width W1 of the touch signal line 250.

The exemplary embodiment in which the second electrode is formed to have the pattern including toothed portions has been described with reference to FIG. 5 and FIG. 6 hereinabove. Hereinafter, an exemplary embodiment in which the second electrode is formed to have a block-shaped pattern will be described with reference to FIG. 7.

Figure 7:
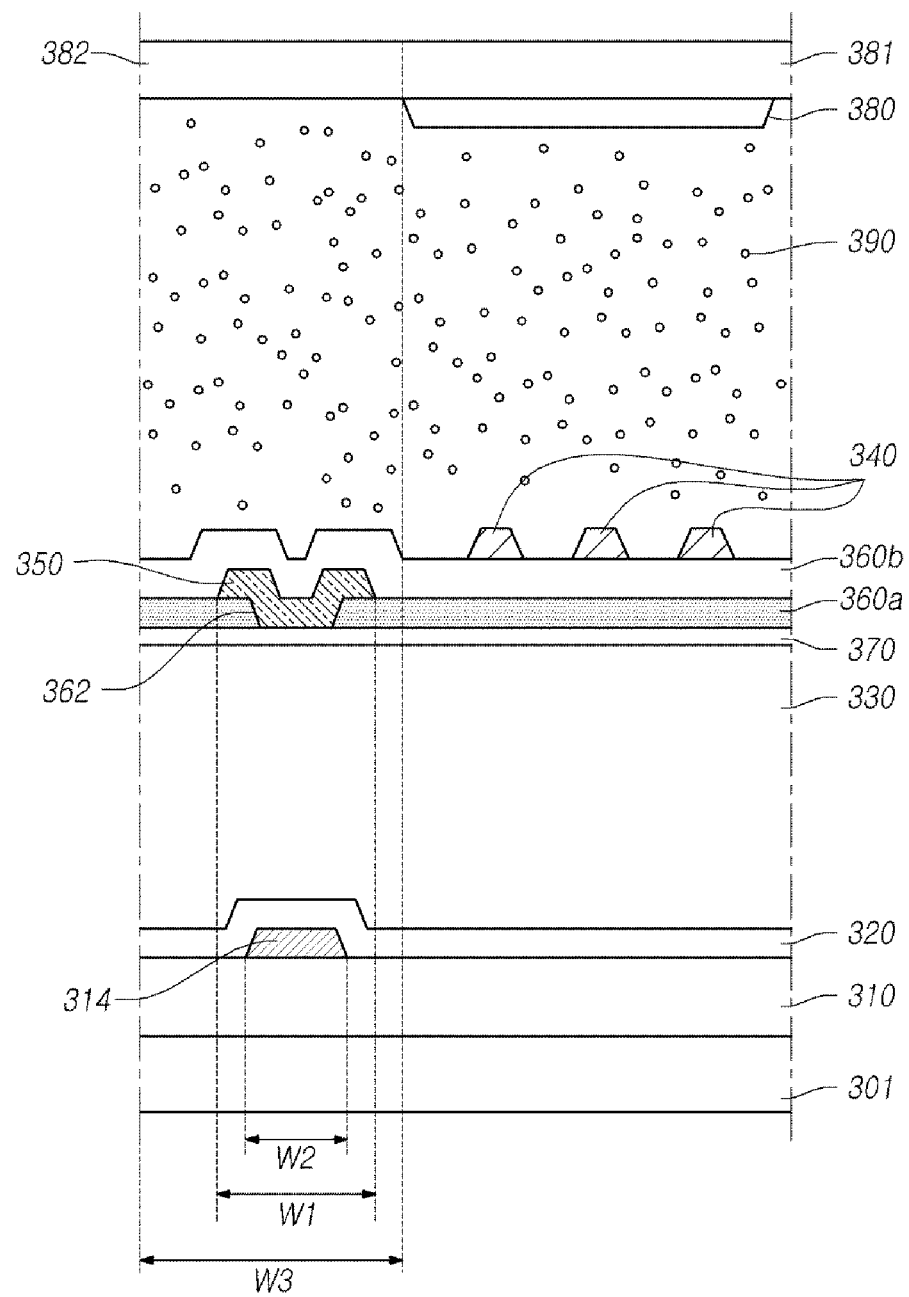
FIG. 7 is a cross-sectional view illustrating a display device according to a further exemplary embodiment.

FIG. 7 is a cross-sectional view illustrating a display device according to a further exemplary embodiment.

Referring to FIG. 7, the display device 300 according to the present disclosure has a pixel structure that is similar to that of the display device 200 according to the previous embodiments as described with reference to FIG. 5 and FIG. 6.

A gate insulating film 310 is disposed on the first substrate 301, and an interlayer insulating film 320 is disposed on the gate insulating film 310.

A data line 314 and source/drain electrodes are disposed on the gate insulating film 310, while an interlayer insulating film 320 and a first protective layer 330 are disposed on the data line 314 and the source/drain electrodes.

The second electrode 370 is disposed on the first protective layer 330. The second electrode 370 may be formed to have a block-shaped pattern. The second electrode 370 functions as a common electrode to which a common voltage is applied through a touch signal line 350, which will be described later, when the display device 200 operates in the display mode and functions as a touch electrode to which a touch driving signal is applied through the touch signal line 350 when the display device 200 operates in the touch mode.

A second protective layer 360a having a contact hole 362 is disposed on the second electrode 370.

The touch signal line 350 is disposed on the second protective layer 360a. The touch signal line 350 is connected to the second electrode 370 through the contact hole 362.

Although the touch signal line 350 and the data line 314 may be disposed in different layers, i.e. in upper and lower layers, the present disclosure is not limited thereto. The touch signal line 350 may overlap the data line 314. Although the width W1 of the touch signal line 350 is wider than the width W2 of the data line 314, the present disclosure is not limited thereto. For example, the width W1 of the touch signal line 350 may be substantially equal to the width W2 of the data line 314 or may be narrower than the width W2 of the data line 314, as long as the difference therebetween is relatively insignificant.

Since the touch signal line 350, the width W1 of which is greater than the width W2 of the data line 314, is disposed in a different layer from the data line 314, the touch signal line 350 can function as a black matrix for the corresponding pixels.

The touch signal line 350 may be formed as a monolayer structure or a multilayer structure. The touch signal line 350 may be formed of at least one selected from, but not limited to, the group consisting of aluminum (Al), tungsten (W), copper (Cu), molybdenum (Mo), chromium (Cr), titanium (Ti), molybdenum tungsten (MoW), molybdenum titanium (MoTi), and copper/molybdenum titanium (Cu/MoTi). The composition of the touch signal line 350 may further include one selected from, but not limited to, the group consisting of indium tin oxide (ITO), indium zinc oxide (IZO), and carbon nanotubes (CNTs) to form a transparent conductive material layer.

A third protective layer 360 including the contact hole 362 is disposed on the touch signal line 350.

The first electrode 340 is disposed on the third protective layer 360b. The first electrode 340 may be formed to have a pattern including toothed portions. The first electrode 340 is connected to one electrode of source and drain electrodes of a thin-film transistor.

Here, the display device 300 has a pixel structure in which the first electrode 340 is positioned above the second electrode 370. The first electrode 340 is formed to have a pattern including a toothcomb portion. The first electrode 340 and the block-shaped second electrode 370 are positioned in difference layers while intersecting each other.

The display device 300 further includes a second substrate 381 opposing the first substrate 301 and a liquid crystal layer 390 situated between the first substrate 301 and the second substrate 381. The second substrate 381 has a color filter 380 opposing the first electrode 340.

In general, when the second substrate 381 has the color filter 380, a black matrix is situated between the second substrate 381 and the color filter 380 to prevent color interference and light leakage between pixels. However, according to the present embodiment, no black matrix is disposed in a position on the second substrate 381 corresponding to the touch signal line 350 of the first substrate 301. Although an area 382 of the second substrate 381 having no black matrix therein may form a hollow space as illustrated in FIG. 7, the color filter 380 may occupy at least a portion of the area 382. Thus, any component other than the black matrix or the color filter 380 may be disposed in the area 382 as required.

In the first substrate 301, the width W1 of the touch signal line 350 is greater than the width W2 of the data line 314. The width W3 of the area 382 in the second substrate 381 without the black matrix is greater than the width W1 of the touch signal line 350. However, the present disclosure is not limited thereto.

As described above, the touch signal line 350, the width W1 of which is greater than the width W2 of the data line 314, is positioned in a different layer from the data line 314 to function as a black matrix. It is thereby possible to prevent color interference and light leakage between pixels, even in the case in which no black matrix is disposed on the second substrate 381.

Since the touch signal line 350, the width W1 of which is narrower than the width W3 of the area 382 corresponding to the black matrix, functions as the black matrix, the transmittance or the aperture ratio of the display device 300 can be improved by an amount corresponding to the difference W3−W1 between the width W3 of the area 382 corresponding to the black matrix and the width W1 of the touch signal line 350.

Figure 8:
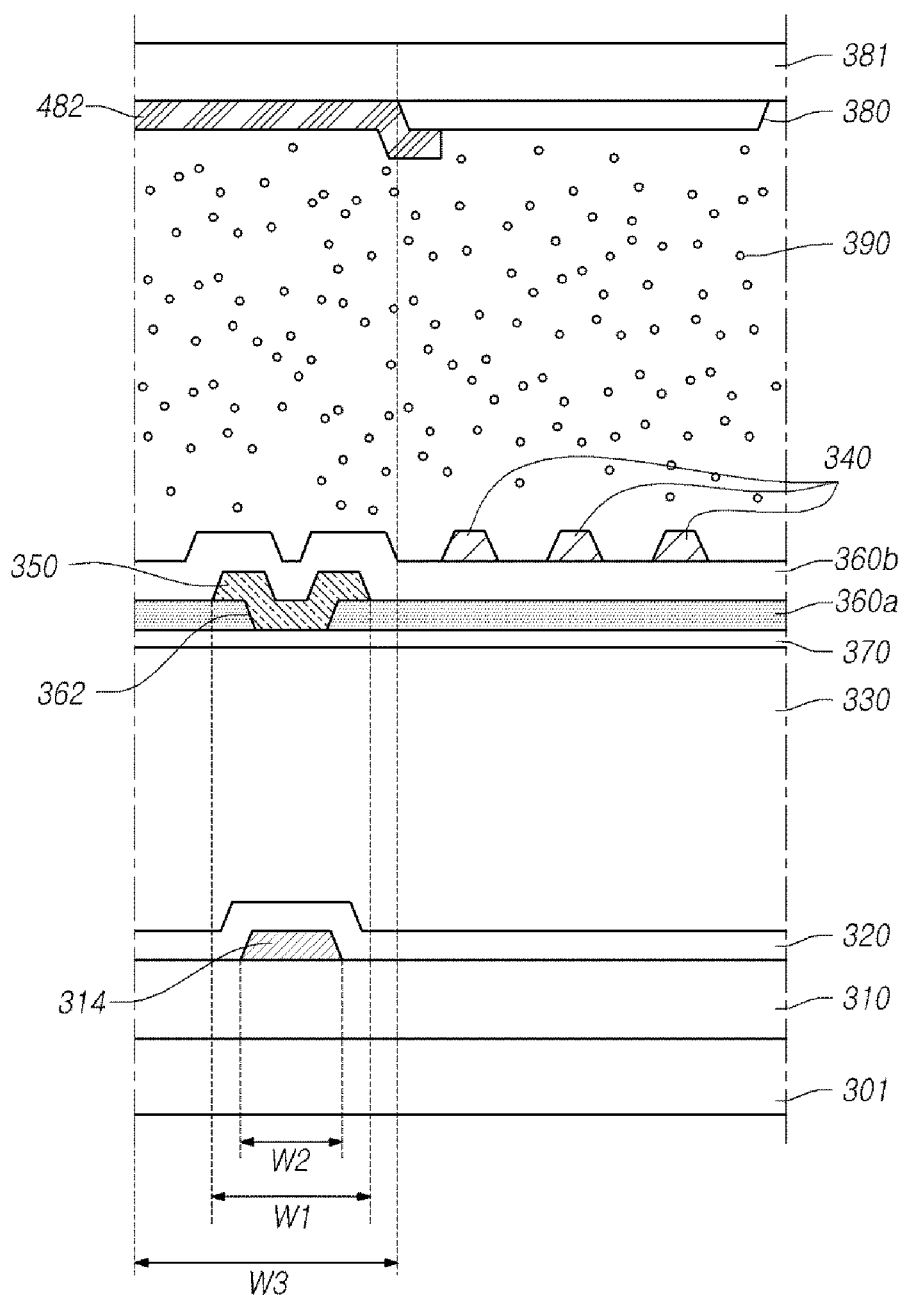
FIG. 8 is a cross-sectional view illustrating a display device according to a comparative example.

FIG. 8 is a cross-sectional view illustrating a display device according to a comparative example.

Referring to FIG. 8, the display device 400 according to the comparative example is similar to the display device 300 according to the further embodiment described with reference to FIG. 7. However, the display device 400 according to the comparative example differs from the display device 300 according to the embodiment illustrated in FIG. 7, in that a black matrix 482 is disposed in the area 382 of the second substrate 381 in which no black matrix is disposed in the display device 300 illustrated in FIG. 7.

While the display device 300 according to the embodiment illustrated in FIG. 7 prevents color interference and light leakage between pixels using the touch signal line 350. In contrast, the display device 400 according to the comparative example illustrated in FIG. 8 prevents color interference and light leakage between pixels using the black matrix 482.

A sample of the display device 300 according to the exemplary embodiment illustrated in FIG. 7 and a sample of the display device 400 according to the comparative example illustrated in FIG. 8 were fabricated by setting the width W3 of the black matrix 482 to 5 μm, the width W1 of the touch signal line 350 to 3.4 μm, the width W2 of the data line 314 to 2 μm, and the other components to be the same as above. The transmittances and the aperture ratios of the two display devices are compared in Table 1.

TABLE 1

| | | Comp. Example 400 | Embodiment 300 |
| --- | --- | --- | --- |
| Open Area | Aperture Ratio | 68.10% | 71.60% |
| | Area | 2581.93 | 2716.473 |
| | Transmittance | 0.1778 | 0.179 |

It can be appreciated from Table 1 that the aperture ratio of the display device 300 according to the exemplary embodiment illustrated in FIG. 7 was increased by 3.5% as compared to the aperture ratio of the display device 400 according to the comparative example illustrated in FIG. 8.

The aperture ratio of the display device 200 according to the exemplary embodiment illustrated in FIG. 5 and FIG. 6 was observed to be substantially the same as the aperture ratio of the display device 300 according to the exemplary embodiment illustrated in FIG. 7.

Unlikely from the display device 400 according to the comparative example illustrated in FIG. 8, none of the above-described display devices according to the exemplary embodiments 200 and 300 has a black matrix disposed on the second substrate. It is therefore possible to reduce the number of process steps, thereby reducing fabrication costs.

According to the exemplary embodiments as set forth above, the display device having a touchscreen panel integrated therewith can omit the black matrix, thereby simplifying the fabrication process thereof and improving the aperture ratio thereof.

The foregoing descriptions and the accompanying drawings have been presented in order to explain the certain principles of the present disclosure. A person skilled in the art to which the disclosure relates can make many modifications and variations by combining, dividing, substituting for, or changing the elements without departing from the principle of the disclosure. The foregoing embodiments disclosed herein shall be interpreted as illustrative only but not as limitative of the principle and scope of the disclosure. It should be understood that the scope of the disclosure shall be defined by the appended Claims and all of their equivalents fall within the scope of the disclosure.

What is claimed is:

1. A display device comprising:
   a first substrate;
   a plurality of gate lines and a plurality of data lines on the first substrate defining a plurality of pixels;
   a thin film transistor including a source electrode, a drain electrode and a gate electrode at the pixels;
   a first protective layer on the plurality of data lines;
   a first electrode functioning as a pixel electrode disposed on the first protective layer within a first area where a color filter is disposed;
   a touch signal line disposed on the first protective layer within a second area where no color filters is disposed, wherein the touch signal line has a width greater than a width of the data lines;
   a second protection layer disposed on the first electrode and the touch signal line;
   a plurality of second electrodes functioning as a common electrode; and
   a touch electrode disposed on the second protection layer, wherein the second electrode among the plurality of second electrodes over the second area is in contact with the touch signal line through a contact hole in the second protection layer.

2. The display device according to claim 1, wherein the second electrode functions as a common electrode in a display mode and functions as a touch electrode in a touch mode.

3. The display device according to claim 1, wherein the second electrode has a block-shaped pattern or a pattern including a toothcomb portion.

4. The display device according to claim 1, wherein the first electrode is connected to one of the drain electrode and the source electrode.

5. The display device according to claim 4, wherein the first electrode has a block-shaped pattern or a pattern including a toothcomb portion.

6. The display device according to claim 1, wherein the contact hole overlap a part of the gate lines.

7. The display device according to claim 1, wherein the data lines, the touch signal line, opposite edges of the first electrode and opposite edges of the second electrode are parallel to one another.

8. The display device according to claim 1, further comprising:
   a second substrate opposing the first substrate, the second substrate comprising a plurality of color filters facing the first electrode.

9. The display device according to claim 8, wherein the touch signal line on the first substrate is positioned between a plurality of the color filters on the second substrate.

10. The display device according to claim 9, wherein the data lines on the first substrate is positioned between a plurality of the color filters on the second substrate.

11. The display device according to claim 9, wherein a distance between each two of the plurality of the color filters is larger than the width of the touch signal line or the data lines.

12. The display device according to claim 1, wherein the touch signal line, the data lines and the second electrode overlap a part of the gate lines.

13. A display device having an integrated touchscreen panel on a first substrate, comprising:
   a first substrate;
   a plurality of data lines and gate lines on the first substrate;
   a plurality of pixels where the data lines and the gate lines intersect with one another;
   a first protective layer on the plurality of data lines;
   a first electrode functioning as a pixel electrode on the the first protective layer within a first area where a color filter is disposed;
   a touch signal line disposed on the first protective layer within a second area where no color filters is disposed, wherein the touch signal line has a width greater than a width of the data, and a common voltage and a touch driving signal are supplied through the touch signal line in the display mode and the touch mode, respectively, a second protection layer on the first electrode and the touch signal line;

a plurality of second electrodes functioning as a common electrode; and a touch electrode disposed on the second protection layer, wherein the second electrode among the plurality of second electrodes over the second area is in contact with the touch signal line through a contact hole in the second protection layer.

14. The display device according to claim 13, wherein the second electrode has one of a block-shaped pattern and a toothcomb pattern.

15. A display device comprising:

a first substrate;

a plurality of gate lines and a plurality of data lines on the first substrate defining a plurality of pixels;

a thin film transistor including a source electrode, a drain electrode and a gate electrode at the pixels;

a first protective layer on the plurality of data lines;

a pixel electrode disposed on the first protective layer within a first area where a color filter is disposed;

a touch signal line disposed on the first protective layer within a second area where no color filters is disposed, wherein the touch signal line has a width greater than a width of the data lines; and a second protective layer between the touch signal line and the data lines, a plurality of second electrodes functioning as a common electrode; and a touch electrode disposed on the second protection layer, wherein the second electrode among the plurality of second electrodes over the second area is in contact with the touch signal line through a contact hole in the second protection layer.

16. The display device according to claim 15, wherein the data lines, the touch signal line, opposite edges of the pixel electrode and opposite edges of the common/touch electrode are parallel to one another.

* * * * *